(12) United States Patent
Hayakawa et al.

(10) Patent No.: US 9,978,827 B2
(45) Date of Patent: May 22, 2018

(54) METHOD OF MANUFACTURING ORGANIC EL DISPLAY DEVICE AND ORGANIC EL DISPLAY DEVICE

(71) Applicant: Japan Display Inc., Minato-ku (JP)

(72) Inventors: Haruhito Hayakawa, Minato-ku (JP); Hiroki Ohara, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days. days.

(21) Appl. No.: 15/280,380

(22) Filed: Sep. 29, 2016

(65) Prior Publication Data

US 2017/0133451 A1    May 11, 2017

(30) Foreign Application Priority Data

Nov. 6, 2015   (JP) .................................. 2015-218940

(51) Int. Cl.
| | | |
|---|---|---|
| *H01L 27/32* | (2006.01) | |
| *H01L 51/00* | (2006.01) | |
| *H01L 51/52* | (2006.01) | |

(52) U.S. Cl.
CPC ...... *H01L 27/3276* (2013.01); *H01L 27/3258* (2013.01); *H01L 51/003* (2013.01); *H01L 51/0097* (2013.01); *H01L 51/524* (2013.01); *H01L 51/5253* (2013.01); *H01L 2227/323* (2013.01); *H01L 2251/5338* (2013.01); *Y02E 10/549* (2013.01)

(58) Field of Classification Search
CPC ............. H01L 27/3258; H01L 27/3276; H01L 51/0097; H01L 51/524; H01L 51/5253; H01L 51/003; H01L 2227/323; H01L 2251/5338; H01L 27/32; H01L 51/00; Y02E 10/549

See application file for complete search history.

(56) References Cited

U.S. PATENT DOCUMENTS

| | | | | |
|---|---|---|---|---|
| 8,853,686 | B2 * | 10/2014 | Chae | H01L 27/1225 257/43 |
| 9,614,017 | B2 * | 4/2017 | Li | H01L 27/3258 |
| 9,659,966 | B2 * | 5/2017 | Kwak | H01L 27/1218 |

(Continued)

FOREIGN PATENT DOCUMENTS

| | | |
|---|---|---|
| JP | 2007-73353 | 3/2007 |
| JP | 2007-80569 | 3/2007 |

(Continued)

*Primary Examiner* — Thanh T Nguyen

(74) *Attorney, Agent, or Firm* — Oblon, McClelland, Maier & Neustadt, L.L.P.

(57) ABSTRACT

Provided are an organic EL display device and a method of manufacturing the organic EL display device for preventing damage caused in a process of exposing terminals and for improving light extraction from the display. A glass substrate is removed from a panel that is formed by sequentially laminating a TFT substrate, a sealing film, a flexible substrate layer, and the glass substrate. A portion of the flexible substrate layer is removed that is formed on a position corresponding to a terminal part of the TFT substrate. A transparent thin film is formed on the flexible substrate layer, and a portion of the sealing film is removed by using the transparent thin film as a mask. The portion of the sealing film is formed on the position corresponding to the terminal part of the TFT substrate.

6 Claims, 5 Drawing Sheets

(56) References Cited

U.S. PATENT DOCUMENTS

| | | | |
|---|---|---|---|
| 2005/0263775 A1* | 12/2005 | Ikeda | G09G 3/3291 |
| | | | 257/79 |
| 2007/0138954 A1 | 6/2007 | Takayama et al. | |
| 2010/0108638 A1 | 5/2010 | Gavillet et al. | |
| 2016/0064421 A1* | 3/2016 | Oh | H01L 27/1222 |
| | | | 257/43 |

FOREIGN PATENT DOCUMENTS

| | | |
|---|---|---|
| JP | 2007-88491 | 4/2007 |
| JP | 2009-205941 | 9/2009 |
| JP | 2010-115922 | 5/2010 |

* cited by examiner

METHOD OF MANUFACTURING ORGANIC EL DISPLAY DEVICE AND ORGANIC EL DISPLAY DEVICE

CROSS-REFERENCE TO RELATED APPLICATION

The present application claims priority from Japanese Application JP2015-218940 filed on Nov. 6, 2015. This application is hereby incorporated by reference into this application.

BACKGROUND OF THE INVENTION

1. Field of the Invention

The present invention relates to a method of manufacturing an organic electroluminescence (EL) display device and the organic EL display device.

2. Description of the Related Art

As disclosed in JP2009-205941A, for example, a flexible display includes an organic EL layer formed on a thin film transistor (TFT) substrate on which a TFT is formed. In order to protect such organic EL layer from moisture, for example, the organic EL layer is covered by a sealing film. Here, terminals formed on a display (the terminals are connections with external terminals) are exposed by etching a portion of the sealing film that is formed over the terminals to remove the portion.

SUMMARY OF THE INVENTION

However, when a flexible substrate formed on the sealing film functions as a mask in the etching process for exposing the terminals, the flexible substrate can be damaged and problems such as reduced light extraction efficiency and deteriorated organic EL layers may occur.

One or more embodiments of the present invention have been conceived in view of the above, and an object thereof is to provide an organic EL display device and a method of manufacturing the organic EL display device for preventing damage caused in a process of exposing terminals and for improving light extraction from the display.

(1) A method of manufacturing an organic EL display device according to the present invention includes removing a glass substrate from a panel that is formed by sequentially laminating a TFT substrate, a sealing film covering the TFT substrate, a flexible substrate layer covering the sealing film, and the glass substrate, wherein the TFT substrate has a laminated structure and a plural y of transistors formed on the TFT substrate, and the laminated structure has a first electrode, an organic EL layer, and a second electrode that are laminated therein;

removing a portion of flexible substrate layer, wherein the portion is formed on a position corresponding to a terminal part of the TFT substrate;

forming a transparent thin film on the flexible substrate layer; and removing a portion of the sealing film by using the transparent thin film as a mask, wherein the portion is formed on the position corresponding to the terminal part of the TFT substrate.

(2) In the method of manufacturing the organic EL display device as described in the above (1), the transparent thin film may be formed on the flexible substrate layer after the portion of the flexible substrate layer is removed.

(3) in the method of manufacturing the organic EL display device as described in the above (1), the transparent thin film may include a portion formed on the portion of the flexible substrate layer; and the portion of the flexible substrate layer and the portion of the transparent thin film may be removed together.

(4) Another method of manufacturing an organic EL display device according to the present invention includes forming a panel by sequentially laminating a TFT substrate, a sealing film covering the TFT substrate, a flexible substrate layer covering the sealing film, a transparent thin film, and a glass substrate, wherein the TFT substrate has a laminated structure and a plurality of transistors formed on the TFT substrate, and wherein the laminated structure has a first electrode, an organic EL layer, and a second electrode that are laminated therein;

removing the glass substrate from the panel;

removing a portion of the flexible substrate layer and a portion of the transparent thin film respectively, wherein the portions of the flexible substrate layer and the transparent thin film are formed on a position corresponding the terminal part of the TFT substrate; and removing a portion of the sealing film by using the transparent thin film as a mask, wherein the portion of the sealing film is formed on the position corresponding to the terminal part of the TFT substrate.

(5) In the method of manufacturing the organic EL display device described in any one of the above (1) to (4), the sealing film may be removed by etching.

(6) in the method of manufacturing the organic EL display device described in any one of the above (1) to (5), the flexible substrate layer may be a polyimide layer.

(7) An organic EL display device according to the present invention includes a TFT substrate on which a laminated structure of a first electrode, an organic EL layer, and a second electrode is disposed and a plurality of transistors are formed, a sealing film covering the TFT substrate, a flexible substrate layer covering the sealing film, and a transparent thin film formed on a predetermined position other than a position corresponding to a terminal part of the TFT substrate.

DETAILED DESCRIPTION OF THE INVENTION

Figure 1:
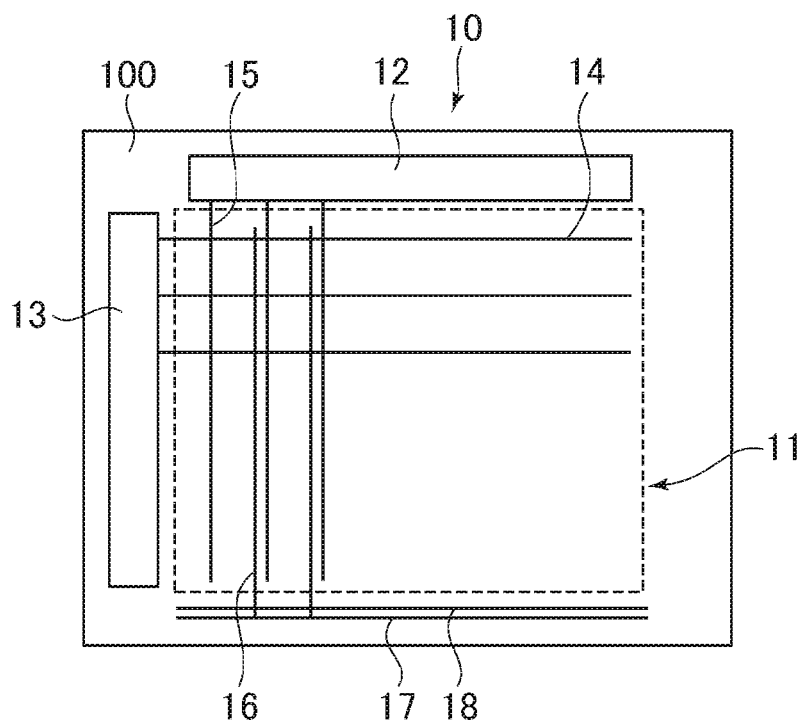
FIG. 1 is a schematic diagram illustrating an organic EL display device.
Figure 2:
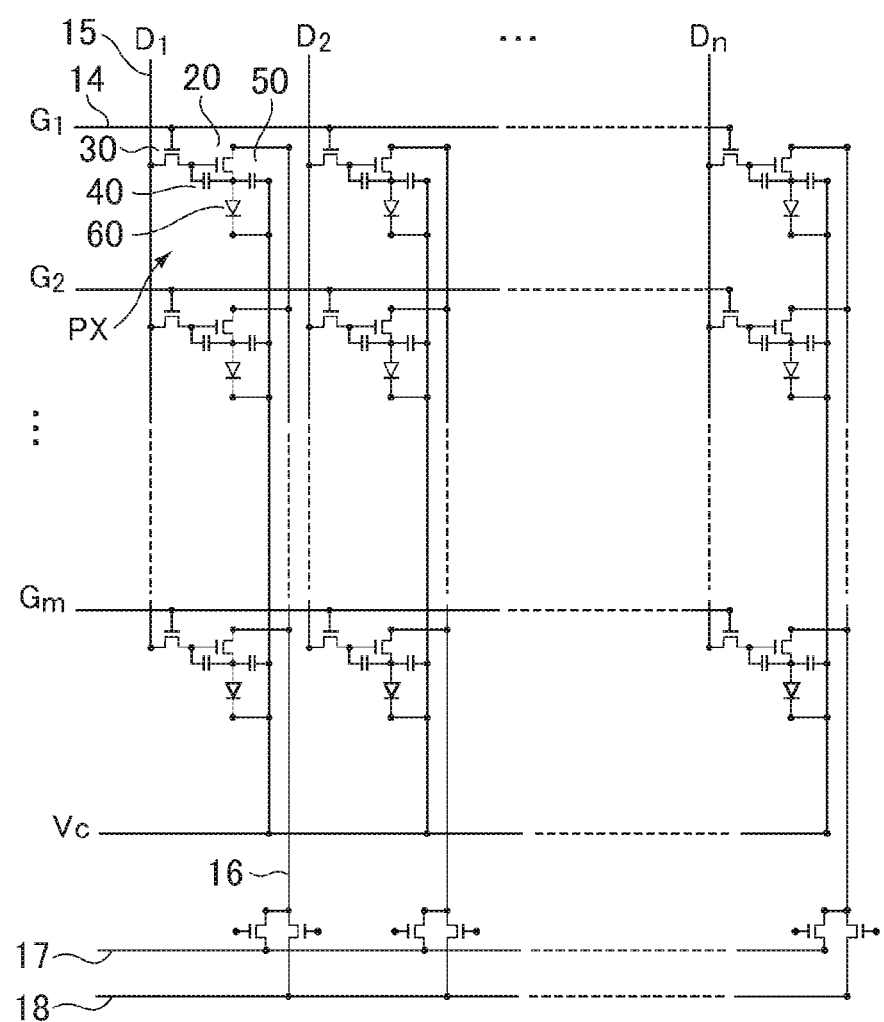
FIG. 2 illustrates an example of a circuit of the organic EL display device.

FIG. 1 is a schematic diagram illustrating an organic EL display device. The organic EL display device 10 controls each pixel formed on a display area 11 on a substrate 100 with use of a data driving circuit 12 and a scan driving circuit 13 to display an image. For example, the data driving circuit 12 is an IC (Integrated Circuit) that generates and transmits a data signal to each pixel, and the scan driving circuit 13 is an IC that generates and transmits a gate signal to a TFT (Thin Film Transistor) provided in each pixel. In FIG. 2, the data driving circuit 12 and the scan driving circuit 13 are formed at two locations, although they may be incorporated into one IC, or formed with a circuit formed directly on the substrate 100.

As shown in FIG. 1, each of scanning lines 14 for transmitting signals from the scan driving circuit 13 is connected to gate electrodes of switching transistors 30. Each of data lines 15 for transmitting signals from the data drive circuit 12 is connected to a source/drain electrode of the switching transistors 30. Each of electric potential lines 16 is applied with a reference electric potential for making organic light emitting diodes 60 emit light, and connected to a source/drain electrode of driver transistors 20. A first electric potential supply line 17 and a second electric potential supply line 18 are connected to an electric potential supply source, and connected to the electric potential line 16 through respective transistors. In this regard, the configuration illustrated in FIG. 1 is an example, and the present embodiment is not to be limited to the above described example.

FIG. 2 illustrates an example of a circuit of the organic EL display device according to the present embodiment. The display area 11 of the organic EL display device 10 has data lines 15 and scanning lines 14 each formed therein. The data lines 15 include a first line (D1) to a n-th line (Dn), and the total number of the data lines is n. The scanning lines 14 include a first line (G1) to a m-th line (Gm), and the total number of the scanning lines is m. Plural pixels PX are arranged in a matrix and arrayed in an extension direction of the scanning lines 14 and in an extension direction of the data lines 15. For example, a pixel PX is formed in an area surrounded by G1 and G2, and D1 and D2.

The first scanning line G1 is connected to a gate electrode of a switching transistor 30. When a signal is supplied from the scan driving circuit 13, the switching transistor 30 turns on. In this state, when a signal is supplied to the first data line D1 from the data drive circuit 12, electric charge is stored in a storage capacitor 40, a voltage is applied to the gate electrode of a driver transistor 20, and the driver transistor 20 turns on even when the switching transistor 30 is in an OFF state, the driver transistor 20 stays in an ON state for a given period due to the electric charge stored in storage capacitor 40. The anode of the organic light emitting diode 60 is connected to the electric potential line 16 through the source and the drain of the driver transistor 20, and the cathode of the organic light emitting diode 60 is fixed to a reference electric potential Vc. As such, electric current according to the gate voltage of the driver transistor 20 flows into the organic light emitting diode 60, and the organic light emitting diode 60 emits light. Further, an additional capacitor 50 is formed between the anode and the cathode of the organic light emitting diode 60. The additional capacitor 50 provides an advantage of stabilizing a voltage applied to the storage capacitor 40, and contributes to stable operation of the organic emitting diode 60. The capacitance of the additional capacitor 50 is set to be larger than the capacitance of the storage capacitor 40, which provides the advantage described above.

Figure 3:
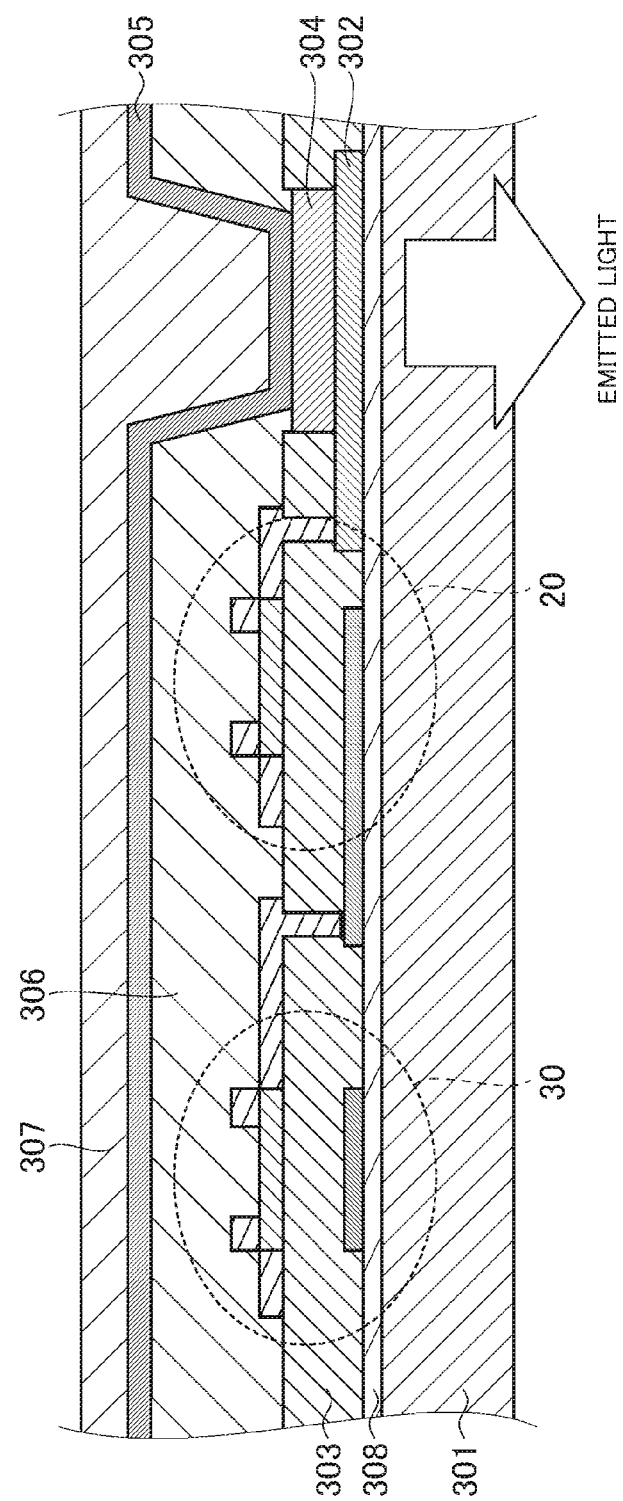
FIG. 3 illustrates an example of a sectional view of a part of the organic EL, display device.

FIG. 3 illustrates an example of a partial cross section of the organic EL display device. As shown in FIG. 3, a first polyimide layer 301 has a foundation layer 308 formed thereon. Further, the first polyimide layer 301 provided with gate electrodes of the switching transistors 30, gate electrodes of the driver transistors 20, and pixel electrodes (anodes) 302. In the example of FIG. 3, those are formed on the foundation layer 308. Further, a gate insulating film 303 is formed covering the gate electrodes of the switching transistors 30 and the gate electrodes of the driver transistors 20. An organic EL layer 304 is formed on the pixel electrodes 302, and a common electrode 305 (cathode) is formed on the organic EL layer 304. The source/drain electrodes and the channel layer of each switching transistor 30 are formed on the gate insulating film 303. One of the source/drain electrodes of each switching transistor 30 is connected to the gate electrode of the driver transistor 20. The source/drain electrode of the driver transistor 20 is connected to the pixel electrode 302. A protective film 306 is formed on the source/drain electrodes of the switching transistors 30 and the driver transistors 20. A sealing film 307 is formed on the common electrode 305. A second lyimide layer (not shown) is formed on the sealing film 307. The cross-sectional configuration described above is an example and the present embodiment is not limited to the example. For example, a plastic substrate may be used in place of the first and/or second polyimide layer 301.

Next, referring to FIGS. 4A to 4D, a method of manufacturing the organic EL display device according to the present embodiment will be discussed. The manufacturing method of general organic EL display devices is well known, and thus their explanation will be omitted. The following main discusses a process of exposing terminals in a terminal part 504 of a TFT substrate 503 in the manufacturing method of the organic EL display device according to the present embodiment FIGS. 4A to 4D show a cross-section of the organic EL display device 10 and do not show the first glass substrate 501 and the second glass substrate 502. Specifically, FIGS. 4A to 4D show only the TFT substrate 503 on which TFT (e.g., switching transistors 30 and driver transistor 20) is formed, the organic EL layer 304, the sealing film 307, and the polyimide layer 301. In the following, a structure in which the first glass substrate 501 and the second glass substrate 502 are respectively formed on the top and the bottom of the organic EL display device 10 is referred to as "panel". The first polyimide layer 505 and the second polyimide layer 506 respectively correspond to the first polyimide layer 301 and the second polyimide layer (not shown in FIG. 3) described by referring to FIG. 3. The polyimide layers 505 and 506 are flexible substrate layers.

Figure 4A:
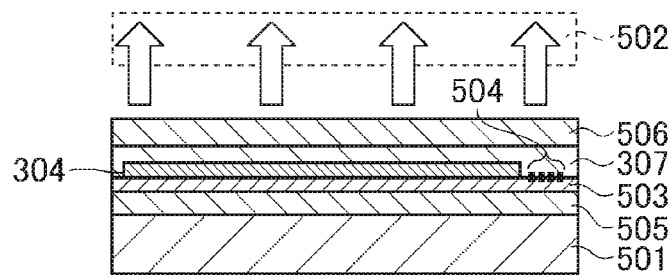
FIG. 4A is a diagram illustrating a manufacturing method of the organic EL display device according to the first embodiment.
Figure 4B:
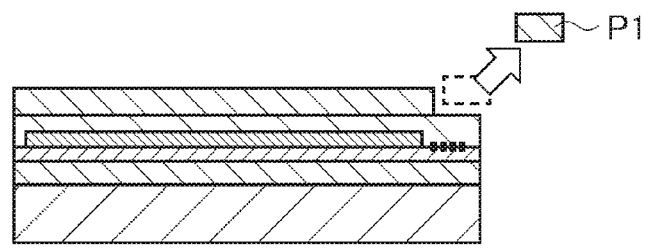
FIG. 4B is a diagram illustrating a manufacturing method of the organic EL display device according to the first embodiment.
Figure 4C:
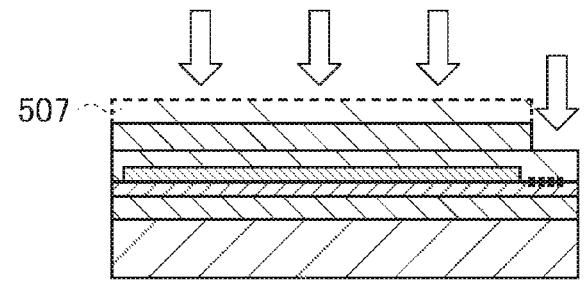
FIG. 4C is a diagram illustrating a manufacturing method of the organic EL display device according to the first embodiment.

As shown in FIG. 4A, the second glass substrate 502 s removed from the panel by irradiating a laser to the panel. Subsequently, as shown in FIG. 4B, a portion of the second polyimide layer 506 that is formed over the terminal part 504 of the TFT substrate 503 is removed by a laser. As shown in FIG. 4C, a transparent flexible thin film 507 is then formed on an area other than the terminal part 504. As illustrated by arrows in FIG. 4C, a portion of the sealing film 307 that is formed over the terminal part 504 is removed by dry etching or wet etching in which the transparent flexible thin film 507 is used as a mask. Here, the material of the transparent flexible thin film 507 and the material of the sealing film 307 are configured so as to secure etch selectivity. That is, the transparent flexible thin film 507 employees a material that allows the sealing film 307 to be selectivity removed. As such, the sealing film 307 is more preferentially removed than the transparent flexible thin film 507. This enables to expose the terminals in the terminal part 504 of the TFT substrate 503 included in the panel.

Figure 4D:
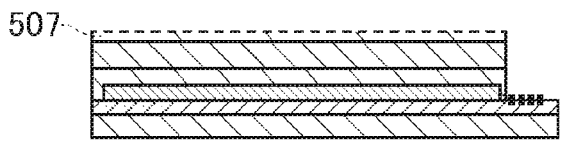
FIG. 4D is a diagram illustrating a manufacturing method of the organic EL display device according to the first embodiment.

Next, as shown in FIG. 4D, the first glass substrate 501 is removed from the panel by irradiating a laser to the panel. As shown in FIGS. 4C and 4D, the transparent flexible thin film 507 may sometimes remain on the second polyimide layer 506. However, the transparent flexible thin film 507 is transparent, and thus can prevent the light extraction efficiency of the panel or the like from being decreased.

The process of exposing the terminals described above may be executed, for example, on a large-sized panel that includes a plurality of the panels, or on the individual panel. When the process of exposing the terminals is executed on the large-sized panel, the large-sized panel needs to be divided into the individual panels at the end of the process. The process of exposing the terminals described above is an example, and the present embodiment is not limited to this example and may be configured as described in a variation below, for example.

[Variation]

Next, a variation of the present embodiment will be discussed. In this variation, similarly to the first embodiment, the second glass substrate 502 is removed from the panel by irradiating the laser to the panel. Subsequently, a transparent flexible thin film 507 is formed on a second polyimide layer 506, including a portion formed over the terminal part 504. Subsequently, a portion of the second polyimide layer 506 that is formed over the terminal part 504 is removed with the laser. The order of forming the flexible than film 507 is different from that of the first embodiment. That is, in contrast to the first embodiment, the transparent flexible thin film 507 is formed on the second polyimide layer 506, and thereafter the portion of the second polyimide layer 506 is removed. In this variation, as described above, the transparent flexible thin film 507 is also formed on the second polyimide layer 506. Accordingly, both of the portions of the transparent flexible thin film 507 and the second polyimide layer 506 are removed with the laser. In the next process, the portion of the sealing film 307 that is located over the terminal part 504 is removed by dry etching or wet etching in which the transparent flexible thin film 507 is used as a mask. Subsequently, the first glass substrate 501 is removed by irradiating a laser to the panel. In this regard, similarly to the first embodiment, the process of exposing the terminals maybe executed, for example, on a large-sized panel that includes a plurality of the panels, or on the individual panel.

Second Embodiment

Next, the second embodiment of the present invention will be discussed. As shown in FIGS. 5A to 5D, the present embodiment is different from the first embodiment in that a transparent flexible thin film 507 is formed in advance between the second glass substrate 502 and the second polyimide layer 506. For this reason, the process of exposing the terminals is also different from that of the first embodiment. In the following, regarding the same points as the first embodiment, their overlapping explanation will be omitted.

Figure 5A:
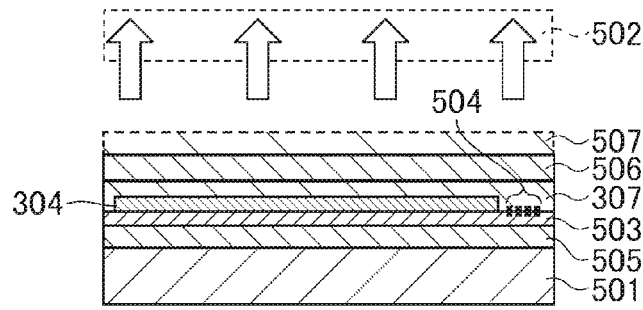
FIG. 5A is a diagram illustrating a manufacturing method o the organic EL display device according to the second embodiment.
Figure 5B:
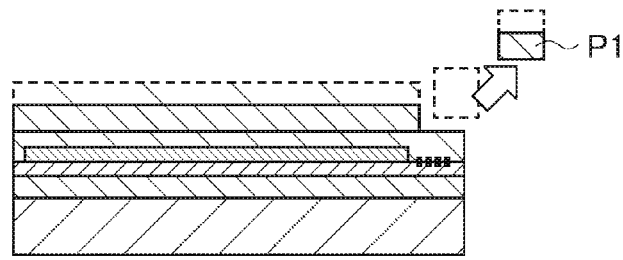
FIG. 5B is a diagram illustrating a manufacturing method of the organic EL display device according to the second embodiment.
Figure 5C:
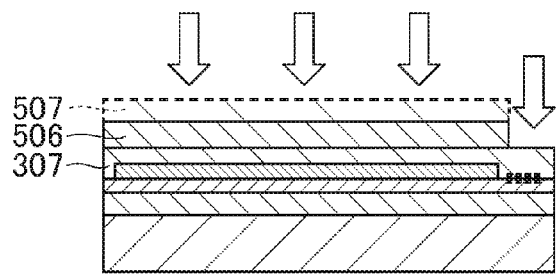
FIG. 5C is a diagram illustrating a manufacturing method of the organic EL display device according to the second embodiment.

FIGS. 5A to 5D illustrate the process of exposing the terminals in the present embodiment. As shown in FIG. 5A, the second glass substrate 502 is removed by irradiating a laser to the panel. Subsequently, as shown in FIG. 5B, a portion of the second polyimide layer 506 that formed over the terminal part 504 is removed with a laser together with a portion of the transparent flexible thin film 507 formed on the portion of the second polyimide layer 506. In this way, the sealing film 307 over the terminal part 504 is exposed.

Figure 5D:
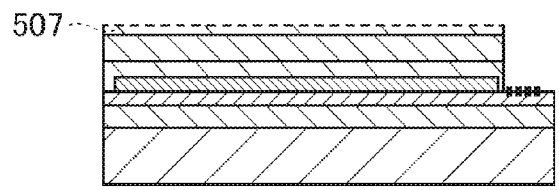
FIG. 5D is a diagram illustrating a manufacturing method or the organic EL display device according to the second embodiment.

Next, the portion of the sealing film 307 that is formed on the terminal part 504 is removed by dry etching or wet etching in which the transparent flexible thin film 507 is used as a mask. As shown in FIG. 5D, the first glass substrate 501 is then removed with a laser.

Similarly to the first embodiment, the process of exposing the terminals described above may be executed, for example, on a large-sized panel including a plurality of the panels, or on the individual panel.

The present invention is not limited to the above described embodiments and may be modified in various manners. For example, the configurations of the embodiments described above may be replaced by configurations that are substantially the same as those of the above-described embodiments, bring about substantially the same effects as those of the above-described embodiments, or achieve substantially the same objects as those of the above-described embodiments. A transparent thin film in the claims corresponds, for example, the transparent flexible thin film 507 described above.

What is claimed is:

1. A method of manufacturing an organic EL display device, comprising:
   removing a glass substrate from a panel that is formed by sequentially laminating a TFT substrate, a sealing film covering the TFT substrate, a flexible substrate layer covering the sealing film, and the glass substrate, wherein the TFT substrate has a laminated structure and a plurality of transistors formed on the TFT substrate, and the laminated structure has a first electrode, an organic EL layer, and a second electrode that are laminated therein;
   removing a portion of the flexible substrate layer, wherein the portion is formed on a position corresponding to a terminal part of the TFT substrate;
   forming a transparent thin film on the flexible substrate layer; and
   removing a portion of the sealing film by using the transparent thin film as a mask, wherein the portion is formed on the position corresponding to the terminal part of the TFT substrate.

2. The method of manufacturing the organic EL display device according to claim 1,
   wherein the transparent thin film is formed on the flexible substrate layer after the portion of the flexible substrate layer is removed.

3. The method of manufacturing the organic EL display device according to claim 1,
   wherein the transparent thin film includes a portion formed on the portion of the flexible substrate layer; and
   wherein the portion of the flexible substrate layer and the portion of the transparent thin film are removed together.

4. A method of manufacturing an organic EL display device comprising:

forming a panel by sequentially laminating a TFT substrate, a sealing film covering the TFT substrate, a flexible substrate layer covering the sealing film, a transparent thin film, and a glass substrate, wherein the TFT substrate has a laminated structure and a plurality of transistors formed on the TFT substrate, and the laminated structure has a first electrode, an organic EL layer, and a second electrode that are laminated therein;

removing the glass substrate from the panel;

removing a portion of the flexible substrate layer and a portion of the transparent thin film respectively, wherein the portions of the flexible substrate layer and the transparent thin film are formed on a position corresponding to the terminal part of the TFT substrate; and removing a portion of the sealing film by using the transparent thin film as a mask, wherein the portion of the sealing film is formed on the position corresponding to the terminal part of the TFT substrate.

5. The method of manufacturing the organic EL display device according to claim 1, wherein the sealing film is removed by etching.

6. The method of manufacturing the organic EL display device according to claim 1, wherein the flexible substrate layer is a polyimide layer.

* * * * *